US008810316B2

(12) United States Patent
Syed et al.

(10) Patent No.: US 8,810,316 B2
(45) Date of Patent: Aug. 19, 2014

(54) METHOD AND APPARATUS FOR IMPLEMENTING A LOW NOISE AMPLIFIER WITH ASSOCIATED GAIN AND INPUT IMPEDANCE (71) Applicant: Motorola Solutions, Inc., Schaumburg, IL (US)

(72) Inventors: Shafiullah Syed, Coral Springs, FL (US); Joseph P. Heck, Fort Lauderdale, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1 day.

(21) Appl. No.: 13/687,589

(22) Filed: Nov. 28, 2012

(65) Prior Publication Data
US 2014/0145790 A1 May 29, 2014

(51) Int. Cl.
*H03F 3/45* (2006.01)
*H03G 3/30* (2006.01)

(52) U.S. Cl.
CPC ..................................... *H03G 3/30* (2013.01)
USPC .......................................... 330/254; 330/278

(58) Field of Classification Search
CPC . H03G 1/0023; H03G 1/0088; H03G 1/0029; H03F 3/45183; H03F 2203/45702; H03F 3/211; H03F 3/602; H03F 3/604; H03F 3/72; H03F 2200/451
USPC .............................. 330/252–261, 124 R, 295
See application file for complete search history.

(56) References Cited

U.S. PATENT DOCUMENTS

| 5,867,778 | A |   | 2/1999 | Khoury et al. |
| 5,977,828 | A | * | 11/1999 | Hu et al. ........................ 330/254 |
| 7,362,178 | B2 |   | 4/2008 | Montemayor et al. |
| 7,561,863 | B2 |   | 7/2009 | Ikeda et al. |
| 7,711,334 | B2 |   | 5/2010 | Sivasubramaniam |
| 7,795,979 | B2 |   | 9/2010 | Ishiguro |
| 8,120,428 | B2 |   | 2/2012 | Montalvo et al. |
| 2006/0068727 | A1 |   | 3/2006 | Salvi |
| 2010/0182090 | A1 |   | 7/2010 | Yang et al. |
| 2011/0177789 | A1 |   | 7/2011 | Cheng et al. |

FOREIGN PATENT DOCUMENTS

EP         2380278 A1    10/2011

OTHER PUBLICATIONS

Hakan Dogan et al—"Analysis and Design of RF CMOS Attenuators"—IEEE Journal of Solid-State Circuits, vol. 43, No. 10—pp. 2269-2283—Oct. 2008.
Yoo et al—"A Design of DC-2GHz Linear-controlled CMOS Attenuator"—IEEE—2002.
Risto Kaunisto et al—"A Linear-control Wide-Band CMOS Attenuator"—IEEE—pp. IV458-IV461—2001.

* cited by examiner

*Primary Examiner* — Hieu Nguyen
(74) *Attorney, Agent, or Firm* — Steven A. May; Barbara R. Doutre (57) ABSTRACT An apparatus with associated gain and input impedance includes gain devices, a switching unit and a resistor. A first differential pair of gain devices and associated bias circuitry is configured to operate in a full gain mode. A second differential pair of gain devices is configured to operate in a reduced gain mode. The switching unit is configured to disable the first differential pair of gain devices and enable the second differential pair of gain devices in the reduced gain mode and to disable the second differential pair of gain devices and enable the first differential pair of gain devices in the full gain mode. The resistor is configured to maintain constant input impedance of the apparatus when in the reduced gain mode.

22 Claims, 5 Drawing Sheets

METHOD AND APPARATUS FOR IMPLEMENTING A LOW NOISE AMPLIFIER WITH ASSOCIATED GAIN AND INPUT IMPEDANCE

FIELD OF THE DISCLOSURE

The present disclosure relates to placement of an attenuator in a low-noise amplifier (LNA), and in particular, to a placement of the attenuator that preserves the noise figure of the LNA and allows for an independent control to adjust bias current in an attenuation mode without consuming any extra current in the attenuation mode.

BACKGROUND

A low-noise amplifier (LNA) is an electronic amplifier used to amplify possibly weak signals, for example, signals captured by an antenna. An LNA is typically placed at the front-end of a radio receiver circuit. The gain (the ability of the amplifier to increase the power or amplitude of a signal from the input to the output) of the LNA is used to reduce the effect of noise (an error or undesired random disturbance of a useful information signal) from subsequent stages of a receive chain. Because the noise of the LNA itself is injected directly into the received signal, it is necessary for the LNA to boost the desired signal power while adding as little noise and distortion as possible, so that the retrieval of this signal is possible in the later stages in the radio receiver circuit. A good LNA has a low noise figure (NF) of, for example, 1 decibel (dB) and a large enough gain of, for example, 20 dB. The NF is a measure of degradation of a signal-to-noise ratio (SNR), caused by components in a radio frequency (RF) receiver chain. A good LNA also should have large enough rejection of inter-modulation distortion (creation of on-channel interference from signals containing two or more different frequencies in a system with nonlinearities) and high enough gain-compression point (the amplitude level above which the LNA's gain begins to fall).

A wideband software definable radio typically requires an LNA topology with a wideband input match, programmable linearity, less than a 2.5 dB noise figure along with a 10 dB step attenuator, and a 50 dB automatic gain control range. As is known, an attenuator reduces the amplitude or power of a signal without appreciably distorting its waveform. Typically, in the LNA topology, a step attenuator is implemented within a circuit in series with the input of the LNA. The step attenuator is typically implemented in front of the LNA, thereby reducing the gain and improving the linearity of the receiver. When the step attenuator is implemented in front of the LNA, inter-modulation distortion is also reduced and additional protection is provided against strong interference.

One disadvantage associated with placing the step attenuator in front of the LNA is, when the step attenuator is turned off, there is a need to have no attenuation (i.e., 0 dB attenuation). Any residual attenuation when the step attenuator is in the off state is attenuation in front of the LNA that adds to the noise figure of the receiver and degrades the sensitivity of the receiver. LNA designs aim to optimize the noise figure and keep it as low as possible. The low noise figure provides the best sensitivity of the receiver so that the receiver can receive relatively weak signals, i.e., maintain the best signal-to-noise ratio under weak signal conditions. The attenuation circuit typically has an insertion loss of 0.5 to 1.5 dB which negatively impacts the LNA noise figure. Therefore, during normal mode of operation when the step attenuator is not engaged, the insertion loss associated with the step attenuator negatively impacts the noise figure of the LNA. In addition, when the step attenuator is placed in front of the LNA, this also affects the input impedance of the LNA in a wideband topology and linearity over the frequency range. Accordingly, there is a need to have the step attenuator and yet not introduce any insertion loss when the step attenuator is not engaged.

When the step attenuator is implemented in front of the LNA, the LNA continues to operate in full current mode when the attenuator is engaged. There is a need, however, to reduce the current drain when the attenuator is engaged. Reducing the current drain may save approximately 1.9 milliwatt (mW) in power.

Accordingly, there is a need for a step attenuator that preserves the noise figure of the LNA while allowing an independent control to adjust bias current in an attenuation mode without consuming any extra current in the attenuation mode.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Some embodiments are directed to methods and apparatuses associated gain and input impedance. The apparatus includes gain devices, a switching unit and a resistor. A first differential pair of gain devices and associated bias circuitry is configured to operate in a full gain mode. A second differential pair of gain devices is configured to operate in a reduced gain mode. The switching unit is configured to disable the first differential pair of gain devices and enable the second differential pair of gain devices in the reduced gain mode and to disable the second differential pair of gain devices and enable the first differential pair of gain devices in the full gain mode. The resistor is configured to maintain constant input impedance of the apparatus when in the reduced gain mode.

Figure 1:
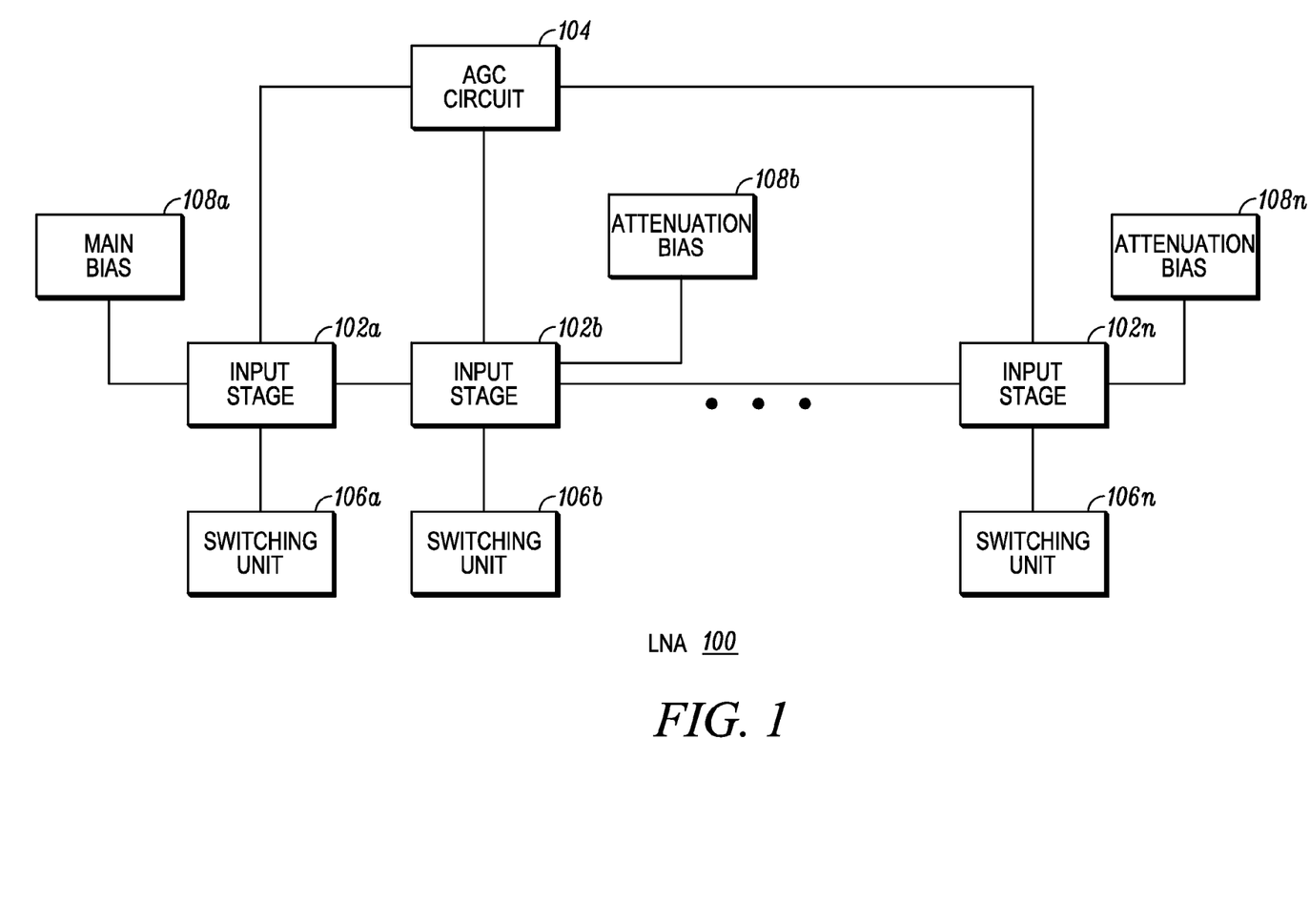
FIG. 1 is a block diagram of an overview of a low noise amplifier (LNA) used in accordance with some embodiments.

FIG. 1 is a block diagram of a low noise amplifier (LNA) 100 used in accordance with some embodiments. LNA 100 includes multiple stages input 102 (i.e., 102a-102n) arranged to preserve the noise figure of LNA 100. Each stage may include a differential pair of gain devices and an associated bias circuitry for operation in a normal/full gain mode or a reduced-gain mode/attenuation state. The gain devices in each input stage 102 may be, for example, n-channel or p-channel field effect transistors (FET). It should be noted that any type of gain device may be used. In some embodiments, one input stage 102 may be engaged at a time. For example, in normal operation or the full gain mode, input stage 102a would be engaged and the other input stages 102b-102n would be disabled. In an attenuation state or the reduced gain mode, one of input stages 102b-102n would be engaged and input stage 102a and the others of input stages input stages 102b-102n that are not engaged would be disabled. Input stage 102a may be considered to be a main LNA input stage and input stages 102b-102n may be considered to be attenuation input stages. In some embodiments, the main input stage may include a single-ended gain device.

LNA 100 also includes a bias circuit 108 (i.e., 108a-108n) for each input stage 102. For example, FIG. 1 shows a main bias circuit 108a for input stage 102a and attenuation bias circuits 108b-108n for each of input stages 102b-102n respectively, wherein each of input stages 102a-102n is biased from its respective bias circuit 108a-108n. Because there is independent bias control on each of the input stages, current can be saved in the attenuation mode because LNA 100 may use less current in the attenuation mode.

Each input stage 102 also includes a switching unit 106 (i.e., 106a-106n) that engages or disables the input stage. In some embodiments, the switching unit includes a controlling input pin or a controlling input pin with a logical inverter associated with each input stage 102 to enable or disable the input stage 102 according on the operating mode. The input stages 102 may be switched in a way that reduces the gain of LNA 100, without degrading the performance of LNA 100 when the attenuation is not engaged. Each of input stages 102b-102n also includes a FET switch or resistor across the input stage for maintaining constant input impedance of the amplifier when in the reduced gain mode.

The arrangement of LNA 100 does not impact the noise figure of LNA 100 during normal operation because the step attenuator path is in parallel with the main LNA. In addition, because the attenuator path is totally independent, it does not add any insertion loss when connected to the LNA during normal operation. The output of the input stages 102 may go to, for example, an automatic gain control (AGC) circuit 104. The arrangement of LNA 100 does not significantly impact the bandwidth of the LNA 100 because the parallel path connects at a low impedance node. The topology of LNA 100, therefore, allows for a parallel path of the load with reduced gain and an impedance match circuit that, not only preserves the noise figure in the normal mode of operation, but also helps reduce the current drain of the LNA in the attenuation mode. Because the topology of LNA 100 does not impact the voltage headroom of the LNA, it is possible to design the LNA for a high third-order intercept point (IIP3) along with an AGC circuit operating with low supply voltage.

Figure 2:
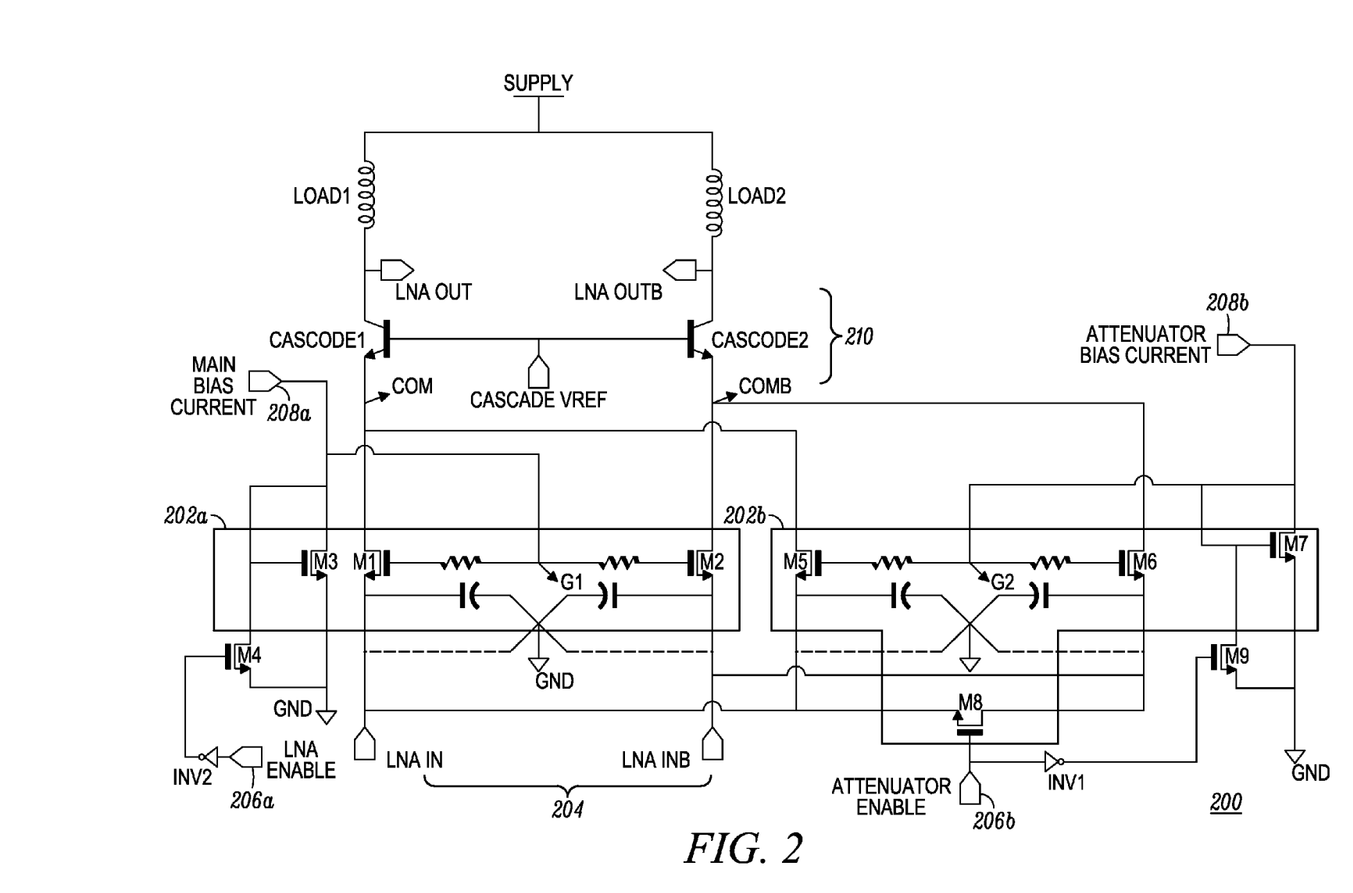
FIG. 2 is a schematic diagram of an embodiment of a dual input stage LNA used in accordance with some embodiments.

FIG. 2 is a schematic diagram of an embodiment of a dual input stage LNA 200 used in accordance with some embodiments. LNA 200 includes two input stages 202 (i.e., 202a and 202b). Each input stage 202 includes differential n-channel metal-oxide-semiconductor field-effect transistors (MOSFET) or NMOS transistors. Each of the MOSFETs in FIG. 2 is labeled as M1-M9. During normal operation or full gain mode, input stage 202a would be engaged and input stage 202b would be disabled. Conversely, when in the attenuation state or reduced gain mode, input stage 202b would be engaged and input stage 202a would be disabled.

Differential LNA inputs (LNA IN and LNA INB) 204 are fed into the source of two NMOS devices (M1 and M2) in input stage 202a and two NMOS devices (M5 and M6) in input stage 202b. Input stage 202a may be referred to as a common gate input stage because the gate terminals are at RF ground, there is no signal on the gate, a pair of resistors is tied to the gate, and the input signals are on the source. There may be bypass caps (C1 and C2 respectively) added at the gates nodes G1 and G2 to allow for RF ground at common gate terminals.

Input stage 202b includes a FET switch/resistor (M8) across the input stage for maintaining constant input impedance of the amplifier when in the reduced gain mode. The input impedance is kept constant by the switch/resistor (M8) across the differential pair of transistors (M5 and M6) on the attenuator side. This ensures that in the attenuation mode, there is, for example, 50 Ohms input impedance. Because there is independent bias control 208a and 208b on the each input stage 202, current can be saved in an attenuation mode because LNA 200 may use less current in the reduced gain mode. Some embodiments may include a single bias circuit (for example, the M3-M4 part of FIG. 2) to bias both the main input stage and the attenuator input stage.

Each input stage 202 also includes a switching unit that engages or disables the input stage according to the operating mode. As noted previously, only one input stage 202 is engaged at a time. For example, in the full gain mode, input stage 202a would be engaged and input stage 202b would be disabled. In the full gain mode when input stage 202a is engaged and input stage 202b is disabled, an LNA ENABLE pin 206a goes high (enable signal is activated) and the output of an inverter (INV2) from LNA ENABLE pin 206a is low. This allows main bias current 208a to engage input stage 202a. During this time, Attenuator ENABLE pin 206b goes low (enable signal is deactivated), the output from an inverter (INV1) connected to Attenuator ENABLE pin 206b is high and pulls the gate voltage on attenuator bias current 208b connected to input stage 202b to disable input stage 202b.

In the attenuation state or reduced gain mode, input stage 202b would be engaged and input stage 202a would be disabled. When this occurs, Attenuator ENABLE pin 206b goes high (enable signal is activated) and output of INV1, from the Attenuator ENABLE pin, is low. This allows attenuator bias 208a to engage input stage 202b. During this time, LNA ENABLE pin 206a goes low (enable signal is deactivated), INV2 output goes high and pulls the gate voltage on main bias 208a to disable input stage 202a. The outputs from the input stages 202 are in parallel, but when one input stage is off, it is in a high impedance state and does not significantly affect the operations of LNA 200.

In the main input stage 202a, from the gate of M1 to the source of M2 and from the gate of M2 to the source of M1, in some embodiments, there may be cross coupling with capacitors to double the gain of the input and make the LNA more balanced. In embodiments where the cross coupled capacitors are not used, the gates of the input transistors may be bypassed to ground with capacitors to keep the gates at signal ground potential. FIG. 2 attempts to show either connection (capacitors to ground or cross coupled capacitors). The cascode devices CASCODE1 and CASCODE2 isolate the main LNA from the following stage, and provide low impedance at the COMA/COMB nodes, minimizing the effect on frequency response that might otherwise be caused by any stray capacitance on these nodes. The bias current is programmable, allowing for linearity (IIP3) control. The cross coupled AC stage also reduces the impact of gain imbalances as the LNA output is fed from the differential inputs simultaneously.

The output of the input stages 202 may go to, for example, a continuous automatic gain control (AGC) stage 210 that includes CASCODE FETs. The arrangement of LNA 200 does not appreciably impact the bandwidth of the LNA 200 because the parallel path connects at a low impedance (COMA/COMB) node, reducing the impact of capacitive loading.

Figure 3:
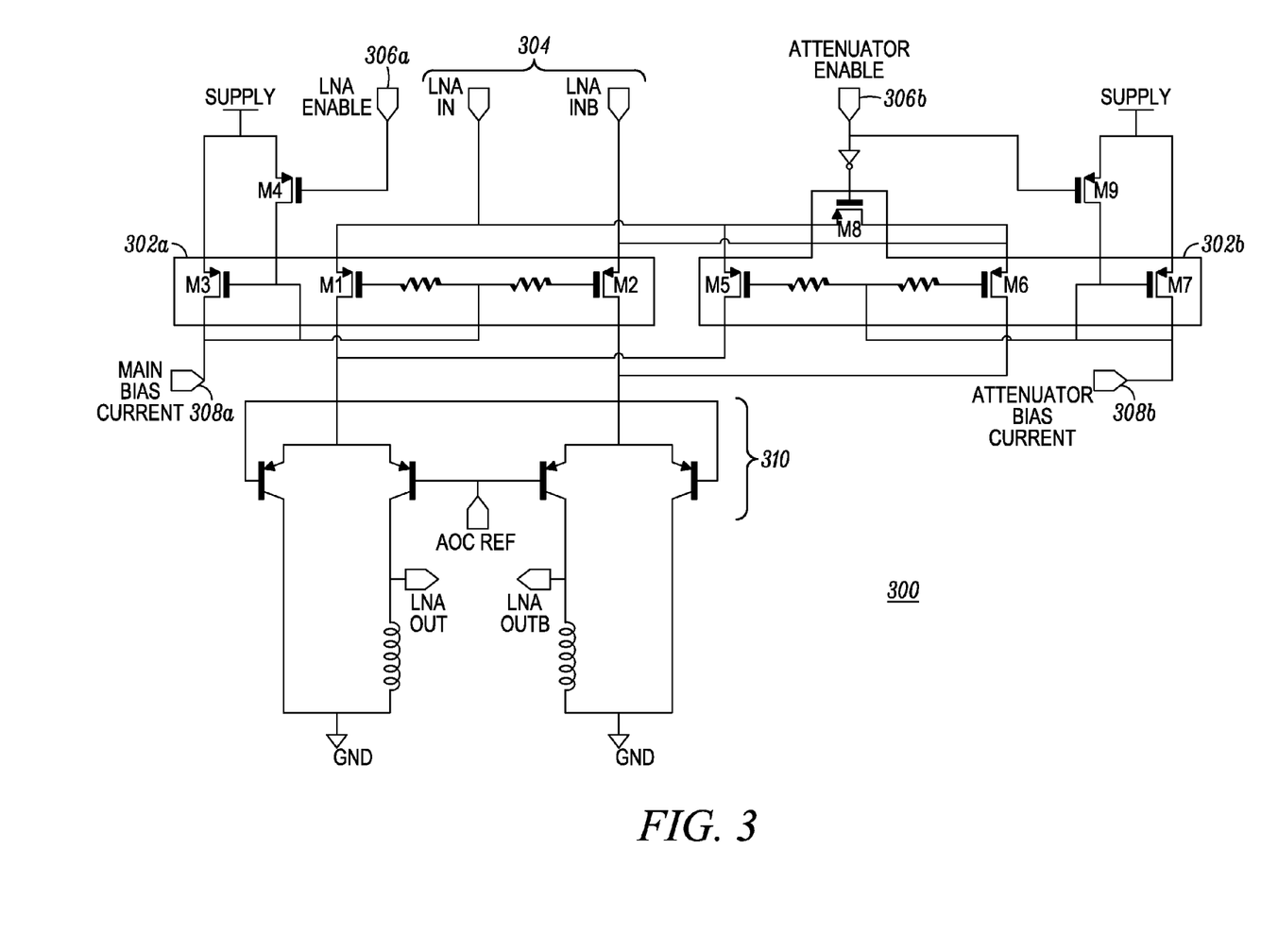
FIG. 3 is a schematic diagram of another embodiment of a dual input stage LNA used in accordance with some embodiments.

FIG. 3 is a schematic diagram of another embodiment of a dual input stage LNA 300 used in accordance with some embodiments. LNA 300 includes two differential input stages 302 (i.e., 302a and 302b) in common gate configuration. One input stage 302 would be engaged in full gain mode or in reduced gain mode. Each input stages 302 includes differential p-channel metal-oxide-semiconductor field-effect transistors (MOSFET) or PMOS. Each of the MOSFET in FIG. 3 is also labeled as M1-M9. When in full gain mode, for example, input stage 302a would be engaged and input stage 302b would be disabled. When in the reduced gain mode, for example, input stage 302b would be engaged and input stage 302a would be disabled. LNA inputs (LNA IN and LNA INB) 304 are fed into the source of two PMOS devices, M1 and M2, in input stage 302a, and two PMOS devices, M5 and M6, in input stage 302b.

To enable input stage 302a, in for example full gain mode or normal operation, LNA ENABLE control line 306a is set high to allow main bias current 308a to engage input stage 302a. To disable input stage 302b, during normal operation, Attenuator ENABLE pin 306b goes low (enable signal is deactivated) and an inverter (INV1) output goes high, setting the gate voltage on attenuator bias 308b to disable input stage 302b.

To enable input stage 302b, in for example the attenuation state, Attenuator ENABLE pin 306b goes high (enable signal is activated) and the output of INV1, from the Attenuator ENABLE pin, is low. This allows attenuator bias current 308b to turn on input stage 302b. During this time, input stage 302a is disabled, for example, by setting LNA ENABLE pin 306 to a low voltage, nominally at ground potential.

The output of the input stages 302 may go to, for example, a continuous automatic gain control (AGC) stage 310 that includes CASCODE FETs. The additional (outer) pnp bipolar transistor shown in FIG. 3 are part of continuous AGC circuit 310.

Figure 4:
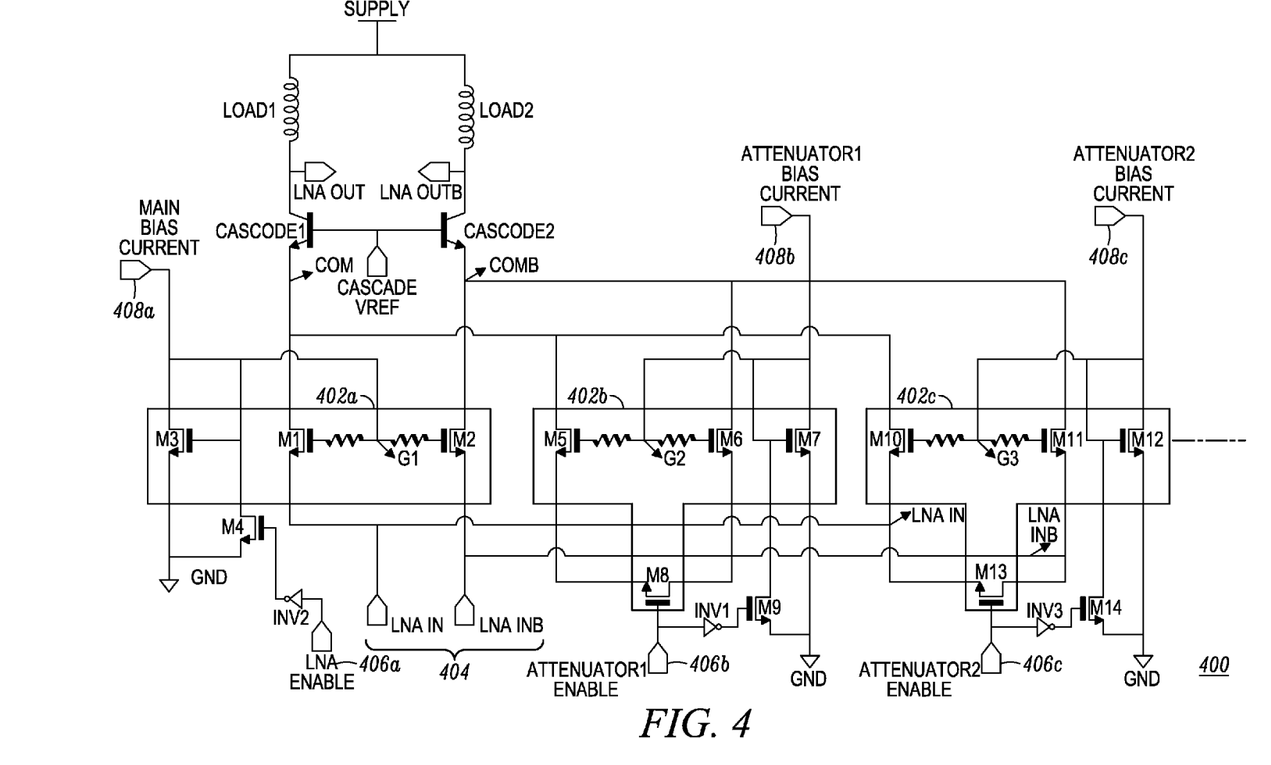
FIG. 4 is a schematic diagram of another embodiment of an LNA with several input stages in accordance with some embodiments.

FIG. 4 is a schematic diagram of another embodiment of an LNA with several input stages in accordance with some embodiments. LNA 400 expands on the embodiment shown in FIG. 2, wherein FIG. 4 includes three differential common gate input stages 402 (i.e., 402a, 402b, and 402c), one of which would be engaged in full gain mode and one of which would be engaged in reduced gain mode. To ensure a RF ground at the common gate terminal, bypass capacitors may be added at each of the gate terminals G1, G2, G3 . . . Gn. It should be noted that the LNA 400 may include more than three differential input stages 402. In FIG. 4, in addition to input stage 402a, LNA 400 includes two attenuation stages 402b and 402c to provide for additional attenuation steps. Each of the MOSFETs used in the input stages 402 is labeled as M1-M14. When in a full gain mode, input stage 402a would be engaged and input stages 402b and 402c would be disabled. Conversely, when in the attenuation state or reduced gain mode, one of input stages 402b or 402c would be engaged and the other would be disabled along with input stage 402a.

LNA inputs (LNA IN and LNA INB) 404 are feed into the source of two NMOS devices (M1 and M2) in input stage 402a, two NMOS devices (M5 and M6) in input stage 402b, and two NMOS (M10 and M11) in input stage 402c. Input stages 402b or 402c include a FET switch/resistor (M8 and M13) across the input stages for maintaining constant input impedance of the amplifier when in the reduced gain mode. The input stages 402 are connected to CASCODE devices, which may be MOSFETs or bipolar junction transistors.

Each input stage 402 also includes a switching unit that engages or disables the input stage according to the operating mode. As noted previously, based on the operating mode, only one input stage 402 is engaged at a time. For example, in the full gain mode, input stage 402a would be engaged and input stages 402b and 402c would be disabled. In the full gain mode when input stage 402a is engaged and input stages 402b and 402c are disabled, LNA ENABLE pin 406a causes main bias current 408a to turn on input stage 402a. During this time, Attenuator ENABLE pins 406b and 406c cause inverters (INV1 and INV3) to pull the gate voltage on attenuator bias 408b and 408c connected to each of input stages 402b and 402c to disable these input stages.

In the reduced gain mode, one of input stages 402b or 402c would be engaged and the other input stages 402b or 402c would be disabled along with input stage 402a. If, for example, input stage 402b is enabled and input stages 402a and 402c are disabled, Attenuator1 ENABLE pin 406b causes the output of INV1 to trigger attenuator bias 408b and turn on input stage 402b and the LNA ENABLE pin 406a and Attenuator2 ENABLE pin 406c cause the output of INV2 and INV3 to trigger the main bias 408a and the attenuator bias 408c and disable input stages 402a and 402c respectively.

An embodiment is directed to a wide-band bipolar junction transistor and complementary metal-oxide-semiconductor (BiCMOS) (100 MHz-2 GHz) LNA topology. This LNA topology may be designed to achieve higher than +5 dBm IIP3 numbers from two input stages, with a voltage gain of 24 dB in 1500 ohms differential load. The noise figure may be simulated at 1.8 dB or better. The circuit may run with a 2.775 V supply, drawing 8 mA current for +5 dBm IIP3. The voltage gain and noise figure are relatively independent of bias current while the IIP3 can be scaled by adjusting the bias current of the buffer stage. The input impedance may be designed at 50 ohms differential into the circuit at around 2 mA of bias current in the input stage. The input impedance is inversely proportional to the transconductance (gm) of the input devices which, in turn, depend on the bias current. This LNA topology may use a MOSFET common gate input topology with cross coupled capacitors for noise canceling and gm enhancement. The step attenuator may be implemented in parallel with the input stage where the signal is routed through a parallel path to AGC bipolar cascode devices, as shown, for example, in FIG. 2. The step attenuator does not impact the bandwidth of the LNA because it is tied to the main path at the low impedance nodes. The linearity and input impedance may be adjustable via programmable bias currents to the LNA, attenuator and buffer stages. The input impedance of the circuit is roughly equal to 2/gm of the input NMOS transistor. The NMOS switch allows for preserving the input impedance while reducing the gain by 10 dB.

It is desirable that the step attenuator used in the LNA topology not consume any additional head room and not add any insertion loss or cause noise figure degradation in the normal mode of operation. Because the LNA topology is shown to include independent bias, the LNA can be programmed to save the current in the attenuation mode independently.

The LNA design has a second stage added to drive the mixer input impedance of approximately 300 ohms. The cross coupled push pull configuration improves the drive capability of the LNA stage into the low impedance node and allows for gain imbalance correction.

Accordingly, this LNA topology does not consume additional supply voltage headroom and does not impact the bandwidth of the wide band LNA as the parallel path is connected at low impedance nodes. The cross coupled BiCMOS buffer stage allows higher linearity with lower current consumption while preserving the bandwidth of the LNA. It also allows for programmability of the linearity as well as independent control of the buffer DC biasing.

Figure 5:
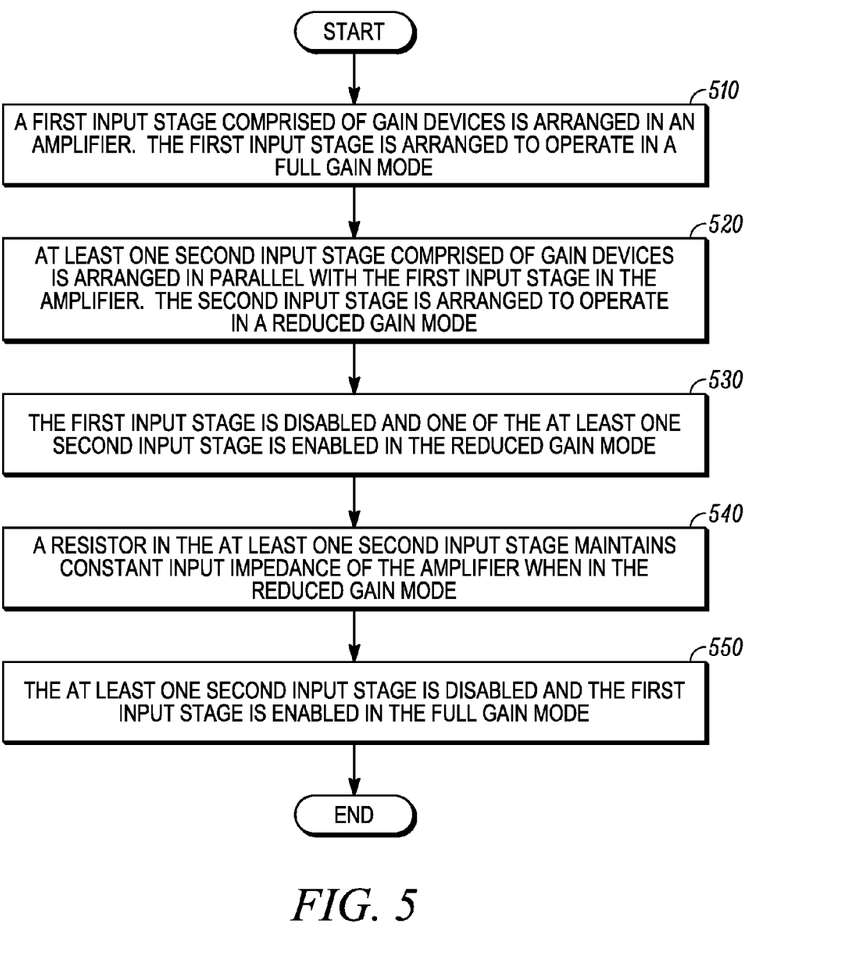
FIG. 5 is a flow diagram for arranging and operating an LNA in accordance with some embodiments.

FIG. 5 is a flow diagram for arranging and operating an LNA in accordance with some embodiments. At 510, a first input stage comprised of gain devices is arranged in an amplifier. The first input stage is arranged to operate in a full gain mode. At 520, at least one second input stage comprised of gain devices is arranged in parallel with the first input stage in the amplifier. The second input stage is arranged to operate in a reduced gain mode. At 530, the first input stage is disabled and one of the at least one second input stage is enabled in the reduced gain mode. At 540, a resistor in the at least one second input stage maintains constant input impedance of the amplifier when in the reduced gain mode. At 550, the at least one second input stage is disabled and the first input stage is enabled in the full gain mode.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus, comprising:
   a first differential pair of gain devices and associated bias circuitry configured for operation in a full gain mode;
   a second differential pair of gain devices configured for operation in a reduced gain mode;
   a switching unit configured to disable the first differential pair of gain devices and enable the second differential pair of gain devices in the reduced gain mode, and to disable the second differential pair of gain devices and enable the first differential pair of gain devices in the full gain mode; and a resistor coupled across the second differential pair of gain devices, the resistor configured to maintain constant input impedance of the apparatus when in the reduced gain mode.

2. The apparatus of claim 1, wherein the resistor is a field effect transistor.

3. The apparatus of claim 1, wherein the second differential pair of gain devices includes two or more differential pair of gain devices, wherein the switching unit is configured to disable the first differential pair of gain devices and enable one of the two or more differential pair of gain devices in the reduced gain mode, and to disable the two or more differential pair of gain devices and enable the first differential pair of gain devices in the full gain mode.

4. The apparatus of claim 1, wherein the first differential pair of gain devices and the second differential pair of gain devices are field effect transistors.

5. The apparatus of claim 1, wherein the second differential pair of gain devices includes an associated bias circuitry for enabling the second differential pair of gain devices in the reduced gain mode and for disabling the second differential pair of gain devices in the full gain mode.

6. The apparatus of claim 1, wherein the switching unit comprises at least one of a controlling input pin or a controlling input pin with a logical inverter associated with each of the first differential pair of gain devices and the second differential pair of gain devices, wherein the switching unit allows an associated bias circuitry for each of the first differential pair of gain devices and the second differential pair of gain devices to enable or disable the associated pair of gain devices according to an operating mode.

7. The apparatus of claim 6, wherein in the full gain mode the associated bias circuitry for the first differential pair of gain devices engages the first differential pair of gain devices when an enable signal associated with the first differential pair of gain devices is activated and output from an inverter connected to the enable pin is low.

8. The apparatus of claim 6, wherein in the full gain mode the associated bias circuitry for the second differential pair of gain devices disables the second differential pair of gain devices when an enable signal associated with the second differential pair of gain devices is deactivated and output from an inverter connected to the enable pin is high and pulls gate voltage on the associated bias circuitry for the second differential pair of gain devices.

9. The apparatus of claim 6, wherein in the reduced gain mode the associated bias circuitry for the first differential pair of gain devices disables the first differential pair of gain devices when an enable signal associated with the first differential pair of gain devices is deactivated and output from an inverter connected to the enable pin is high and pulls gate voltage on the associated bias circuitry for the first differential pair of gain devices.

10. The apparatus of claim 6, wherein in the reduced gain mode the associated bias circuitry for the second differential pair of gain devices enables the second differential pair of gain devices when an enable signal associated with the second differential pair of gain devices is activated and output from an inverter connected to the enable pin is low.

11. The apparatus of claim 1, wherein the first differential pair of gain devices is arranged in parallel with the second differential pair of gain devices.

12. The apparatus of claim 1, wherein output from the first differential pair of gain devices and the second differential pair of gain devices is sent to a continuous automatic gain control circuit.

13. The apparatus of claim 1, wherein inputs are fed into a source of each of two field effect transistors in the first differential pair of gain device and the second differential pair of gain devices.

14. The apparatus of claim 1, wherein a pair of resistors is tied to gate terminals of each of two field effect transistors in the first differential pair of gain devices.

15. The apparatus of claim 1, wherein capacitors are cross coupled from a gate of a first field effect transistor to a source of a second field effect transistor and from the a gate of the second field effect transistor to a source of the first field effect transistor in the first differential pair of gain devices.

16. The apparatus of claim 1, comprising a single bias circuit to bias both the first differential pair of gain devices and the second differential pair of gain devices.

17. An apparatus, comprising:
a first input stage comprised of gain devices configured for operation in a full gain mode;
at least one second input stage comprised of gain devices configured for operation in a reduced gain mode;
a switching unit configured to disable the first input stage and enable one of the at least one second input stage in the reduced gain mode, and to disable the at least one second input stage and enable the first input stage in the full gain mode; and
a resistor in the second input stage, the resistor configured to maintain constant input impedance of the apparatus when in the reduced gain mode.

18. The apparatus of claim 17, wherein the resistor is a field effect transistor across a differential pair of gain devices in the second input stage.

19. The apparatus of claim 17, wherein the gain devices in each of the first input stage and the second input stage are a differential pair of gain devices.

20. The apparatus of claim 17, wherein the gain devices in the first input stage are single-ended gain devices.

21. A method, comprising:
arranging, in an amplifier, a first input stage comprised of gain devices, wherein the first input stage is arranged to operate in a full gain mode;
arranging, in the amplifier, at least one second input stage comprised of gain devices, wherein the at least one second input stage is arranged in parallel with the first input stage and the at least one second input stage is arranged to operate in a reduced gain mode;
disabling, in the amplifier, the first input stage and enabling one of the at least one second input stage in the reduced gain mode;
disabling, in the amplifier, the at least one second input stage and enabling the first input stage in the full gain mode; and
maintaining, by a resistor in the at least one second input stage, constant input impedance of the amplifier when in the reduced gain mode.

22. The method of claim 21, wherein the resistor is coupled across a differential pair of the gain devices in the second input stage.

* * * * *